(12) United States Patent
Salvetat et al.

(10) Patent No.: US 12,234,144 B2
(45) Date of Patent: Feb. 25, 2025

(54) METHOD FOR SEALING CAVITIES USING MEMBRANES

(71) Applicants: COMMISSARIAT A L'ENERGIE ATOMIQUE ET AUX ENERGIES ALTERNATIVES, Paris (FR); SOITEC, Bernin (FR)

(72) Inventors: Thierry Salvetat, Grenoble (FR); Bruno Ghyselen, Seyssinet-Pariset (FR); Lamine Benaissa, Grenoble (FR); Caroline Coutier, Grenoble (FR); Gweltaz Gaudin, Crolles (FR)

(73) Assignees: COMMISSARIAT A L'ENERGIE ATOMIQUE ET AUX ENERGIES ALTERNATIVES, Paris (FR); SOITEC, Bernin (FR)

( * ) Notice: Subject to any disclaimer, the term of this patent is extended or adjusted under 35 U.S.C. 154(b) by 287 days.

(21) Appl. No.: 17/637,040

(22) PCT Filed: Aug. 18, 2020

(86) PCT No.: PCT/FR2020/051476
§ 371 (c)(1),
(2) Date: Feb. 21, 2022

(87) PCT Pub. No.: WO2021/032927
PCT Pub. Date: Feb. 25, 2021

(65) Prior Publication Data
US 2022/0298007 A1    Sep. 22, 2022

(30) Foreign Application Priority Data
Aug. 21, 2019 (FR) ........................ 1909318

(51) Int. Cl.
*B81C 1/00* (2006.01)
*B81B 7/04* (2006.01)

(52) U.S. Cl.
CPC ............ *B81C 1/00182* (2013.01); *B81B 7/04* (2013.01); *B81B 2201/0271* (2013.01); *B81B 2207/053* (2013.01); *B81C 2201/0191* (2013.01)

(58) Field of Classification Search
CPC .............................. B81C 1/00182; B81B 7/04
See application file for complete search history.

(56) References Cited

U.S. PATENT DOCUMENTS

2012/0248063 A1* 10/2012 De Brabander ...... B81B 3/0021
                                                              156/247
2013/0302934 A1* 11/2013 Kato ..................... H10N 30/08
                                                              438/53

FOREIGN PATENT DOCUMENTS

| JP | 2009-291514 A | 12/2009 |
| JP | 2012-147423 A | 8/2012 |
| JP | 2012-169794 A | 9/2012 |

OTHER PUBLICATIONS

International Search Report issued on Nov. 13, 2020 in PCT/FR2020/051476 filed Aug. 18, 2020, 2 pages.
(Continued)

*Primary Examiner* — Moazzam Hossain
(74) *Attorney, Agent, or Firm* — Oblon, McClelland, Maier & Neustadt, L.L.P.

(57) ABSTRACT

A method for sealing cavities using membranes, the method including a) forming cavities arranged in a matrix, of a depth p, a characteristic dimension a, and spaced apart by a spacing b; and b) forming membranes, sealing the cavities, by transferring a sealing film. The method further includes a step a1), executed before step b), of forming a first contour on the front face and/or on the sealing face, the first contour comprising a first trench having a width L and a first depth p1, the formation of the first contour being executed such that after step b) the cavities are circumscribed by the first (Continued)

contour, said first contour being at a distance G from the cavities between one-fifth of b and five b.

18 Claims, 13 Drawing Sheets

(56) References Cited

OTHER PUBLICATIONS

French Preliminary Search Report (with English translation of Categories of Cited Documents) issued on May 6, 2020 in French Application 1909318 filed on Aug. 21, 2019, 2 pages.
Office Action issued Aug. 5, 2024, in corresponding Japanese Patent Application No. 2022-511317, 4 pages.

* cited by examiner

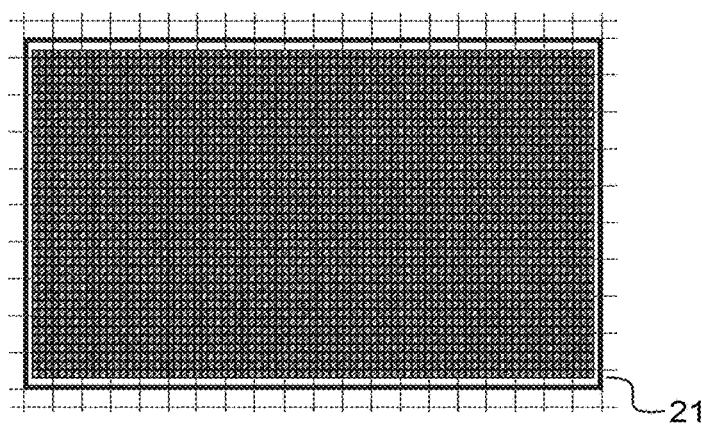
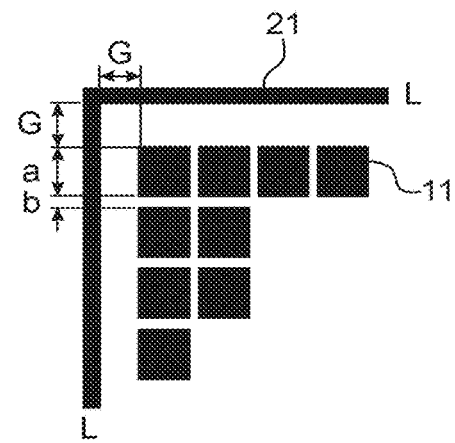
FIG.9a  FIG.9b
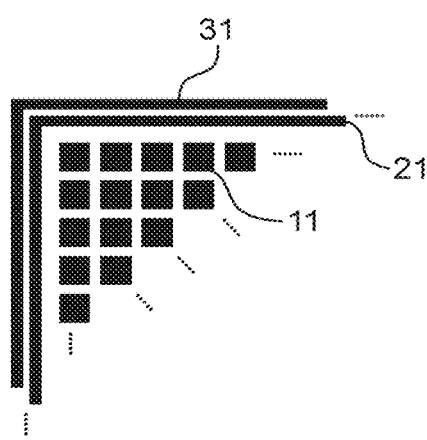
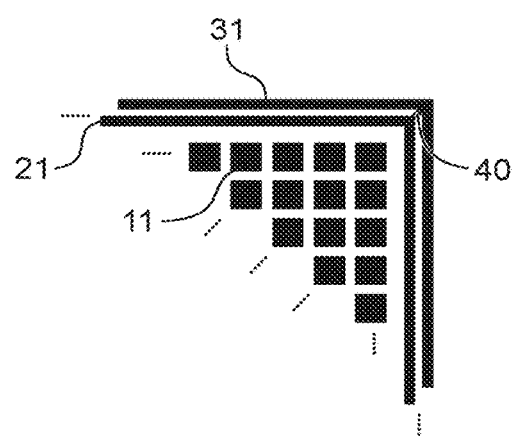
FIG.10a  FIG.10b

METHOD FOR SEALING CAVITIES USING MEMBRANES

TECHNICAL FIELD

The present invention relates to the field of substrates and/or micro-electromechanical systems, particularly for detecting gases or more generally for producing membrane-based transducer devices and particularly ultrasound transducers.

In particular, the present invention relates to a method for manufacturing, collectively, a plurality of membranes sealing cavities.

The method according to the present invention comprises the formation of a first contour, particularly comprising an advantageously continuous first trench, formed around an arrangement of cavities intended to be sealed by membranes. The contour is particularly used to damp or concentrate the deformation liable to be applied to the membranes during the formation thereof.

PRIOR ART

The use of suspended membranes is of growing interest both in the field of micro-electromechanical systems (MEMS) and in that of substrates and particularly temporary substrates.

These membranes, formed by a sealing film, advantageously seal cavities, particularly cavities created on the surface in a support substrate.

A method known from the prior art for forming membranes sealing cavities is illustrated in FIGS. 1a to 1c.

This method particularly comprises the following steps:
i) a step of providing a donor substrate 1 and a receiving substrate 2 provided with cavities $3_1$, $3_2$ opening at a front face 2a of said receiving substrate 2;
ii) a step of assembling the donor substrate 1 and the receiving substrate 2 so as to seal the cavities 3;
iii) a step of thinning the donor substrate 1 so as to retain only a portion of said substrate 1, referred to as sealing film 4, and forming the set of membranes $4_1$, $4_2$, etc.

Thinning step iii), generally executed by means of mechanical etching (grinding) and/or chemical etching, definitively consumes the donor substrate.

Moreover, the uniformity of the sealing film after step iii), which is highly dependent on the technique used in step iii), remains difficult to control.

Moreover, the sealing film sections plumb with the cavities are not subject to any back pressure from the latter. Therefore, it cannot be envisaged to obtain very thin membranes, for example less than 5 μm thick, without risking breaking membranes once step iii) comprises mechanical thinning.

In order to overcome the problems associated with uniformity and with obtaining thin membranes, the donor substrate may be removable (as illustrated in FIG. 2a).

Such a donor substrate 1 particularly comprises a layer, referred to as barrier layer 5 inserted between a mechanical support 6 and the sealing film 4 intended to form the membranes $4_1$, $4_2$ after step iii).

The barrier layer 5 can, in particular, be etched selectively in relation to the sealing film, such that the uniformity of thickness of the membranes is only slightly affected or not affected by the thinning step (FIG. 2c).

For example, once the membranes comprise silicon, the removable donor substrate may be a silicon-on-insulator (SOI) type substrate.

However, such a substrate, the "removal" of which also results in the consumption of the mechanical support and the barrier layer, has a cost which is not compatible with the requirements of the microelectronic and/or micromechanical industries.

Alternatively or additionally, the cavities formed during step i) (FIG. 3a) may be filled with a sacrificial material 7 intended to be removed after step iii) during a step iv) (FIGS. 3c and 3d). However, this latter step requires the formation of an opening in each of the membranes, and the sealing thereof after removing the sacrificial material (FIG. 3e). The latter approach therefore remains complex and is liable to induce modifications in the mechanical behaviour of the membranes.

The so-called "Smart-Cut™" approach, described in the document EP533551, may also be considered.

This approach makes it possible to transfer a sealing film by detaching the latter from a substrate, referred to as donor substrate, at a fracture zone. The fracture zone formed by implantation and/or amorphisation makes it possible to delimit a relatively thin sealing film (particularly of a thickness less than 2 μm, for example 1.5 μm). Moreover, the "Smart-Cut™" approach paves the way for reuse of the donor substrate to transfer a sealing film again.

The membranes formed by the sealing film have a deformation which is not uniform from one membrane to another once the latter are formed on an arrangement, and particularly a matrix arrangement, of cavities.

More particularly, the deformation increases from the centre to the edge of the membrane arrangement.

In this regard, FIG. 4a and FIG. 4b illustrate, respectively, an image obtained using optical interferometry, and a deformation profile of membranes formed by the Smart-Cut™ method and according to a matrix arrangement.

These two figures very clearly show non-uniformity of deformation from one membrane to another.

These deformations of the membranes moreover increase as the thinness of the sealing film increases.

FIG. 5 is a graphic representation of this effect. In particular, FIG. 5 illustrates, according to the bonding conditions (conditions "1", "2", "3", and "4" along the horizontal axis), the observed amplitude (along the vertical axis, in "nm") of the membrane deformations for sealing film thicknesses of 1.5 μm (A), 0.85 μm (B), and 0.2 μm (C).

This variability is also dependent on the environment, particularly the close environment, of the membrane. The greater the distance from other membranes, the greater the deformation.

Finally, this variability is also dependent on the location of the cavity matrix on the receiving substrate 2. FIG. 6A is a graphic representation of the deformations of the membranes of a matrix at the centre and of a matrix at the edge of a substrate (FIG. 6b). In particular, greater variability of the deformations can be observed for a matrix located in the vicinity of the edge of the receiving substrate (FIG. 6A, curve D) relative to an identical matrix located in the vicinity of the centre of said substrate (FIG. 6A, curve E).

The variability of these deformations generates variable electromechanical behaviours of the membranes in MEMS or NEMS type devices for example.

It can also render the execution of subsequent technological steps much more inhomogeneous, complex or even impossible.

An aim of the present invention is that of providing a method for sealing a plurality of cavities using membranes making it possible to reduce the deformation differential therebetween.

DESCRIPTION OF THE INVENTION

The aim of the invention is achieved by a method for sealing a plurality of cavities using a plurality of membranes, the method comprising the following steps:
- a) a step of forming a plurality of cavities opening at a front face of a support substrate or at a sealing face of a sealing film, the cavities, advantageously arranged in a matrix, have a depth p, a characteristic dimension a, and are spaced apart by a spacing b;
- b) a step of forming a plurality of membranes, sealing each of the cavities, by transferring the sealing film overlapping with the front face before the transfer comprising assembling the sealing face with the front face; the method being characterised in that it comprises a step a1), executed before step b), of forming a first contour on one and/or the other of the front face and the sealing face, the first contour comprising an advantageously continuous first trench, having a width L and a first depth p1, the formation of the first contour being executed such that after step b) the plurality of cavities is circumscribed by the first contour, said first contour being at an advantageously essentially constant distance G, from the plurality of cavities between one-fifth of b and five b, advantageously between one-half of b and 2b, more advantageously between 0.9×b and 1.1×b.

According to an embodiment, the width L is between one-fifth of a and five a, advantageously between one half of a and 2a, more advantageously between 0.9×a and 1.1×a.

According to an embodiment, the cavities are of square, round, or polygonal shape and particularly of hexagonal shape.

According to an embodiment, the first depth p1 is equal to the depth p of the cavities.

According to an embodiment, the first contour is formed on the front face, and step b) is followed by a step c) of partially removing the sealing film (16), so as to uncover the first contour, said partial removal retaining a section of the sealing film (16) circumscribed at the first contour.

According to an embodiment, the first contour is formed on the sealing face, and the first depth p1 is less than the thickness of the sealing film.

According to an embodiment, the first contour is formed on the sealing face, and the first depth p1 is greater than or equal to the thickness of the sealing film such that after step b), the first contour is exposed to the external environment.

According to an embodiment, step a1) also comprises forming at least one second contour which comprises a second trench or a series of second cavities around the first trench, advantageously at all points, at an essentially constant distance from the first contour.

According to an embodiment, the depth of the at least one second contour, referred to as second depth p2, is equal to the depth p.

According to an embodiment, the first contour and the at least a second contour are linked by one or more interconnection channels.

According to an embodiment, the one or more interconnection channels link two adjacent corners, respectively, of the first contour and the second contour.

According to an embodiment, the transfer step b) comprises a step b1) of bonding a donor substrate with the support substrate, the donor substrate being provided with the sealing film resting on a handle substrate, followed by a step b2) of removing the handle substrate.

According to an embodiment, step b2) comprises etching by mechanical and/or chemical abrasion.

According to an embodiment, the donor substrate comprises an intermediate layer inserted between the handle substrate and the sealing film, the intermediate layer having an etching selectivity relative to the sealing film and the handle substrate.

According to an embodiment, the donor substrate comprises an embrittlement zone delimiting the sealing film, and configured to break by applying mechanical stress and/or a heat treatment.

According to an embodiment, the embrittlement zone is obtained by species implantation.

According to an embodiment, the sealing film comprises a semiconductor material, advantageously the semiconductor material comprises at least elements chosen from: silicon, germanium, silicon and germanium alloy, indium phosphide, a III-V semiconductor arsenide, a III-V semiconductor phosphide, or a III-V semiconductor nitride, silicon carbide.

According to an embodiment, the sealing film comprises a metallic material, advantageously the metallic material comprises at least elements chosen from: aluminium, copper, titanium, tungsten, tungsten silicide, gold.

According to an embodiment, the sealing film comprises an insulating material, advantageously the insulating material comprises at least elements chosen from: silicon dioxide, silicon nitride.

According to an embodiment, the sealing film comprises a piezoelectric material, advantageously the piezoelectric material comprises at least elements chosen from: lithium tantalate, lithium niobate, aluminium nitride, zinc oxide, zinc and lead tantalate.

The invention also relates to a use of the method according to the invention for manufacturing a micro-electromechanical system.

According to an embodiment, the micro-electromechanical system is a capacitive ultrasound transducer.

The invention also relates to a device provided with a plurality of cavities sealed using a plurality of membranes, the device comprising:
- a) a plurality of cavities opening at a front face of a support substrate or at a sealing face of a sealing film, the cavities, advantageously arranged in a matrix, have a depth p, a characteristic dimension a, and are spaced apart by a spacing b;
- b) a plurality of membranes, sealing each of the cavities, formed by the sealing film assembled with the front face using the sealing face thereof;
- the device being characterised in that it comprises a first contour of a width L on one and/or the other of the front face and the sealing face, the first contour comprising a first trench, and is arranged such that the plurality of cavities is circumscribed by the first contour, said first contour being at an advantageously essentially constant distance G from the plurality of cavities and between one-fifth of b and five b, advantageously between one-half of b and 2b, more advantageously between 0.9×b and 1.1×b.

BRIEF DESCRIPTION OF THE DRAWINGS

Further features and advantages will emerge in the following description of a method for sealing cavities using membranes, given by way of non-limiting examples, with reference to the appended drawings wherein:

FIG. 9a represents a matrix arrangement of cavities surrounded by a trench;

FIG. 9b is an enlargement of the top left corner of the matrix arrangement in FIG. 9a;

FIGS. 10a, 10b are partial representations of the matrix surrounded by the first trench and by a second trench, respectively, without or with an interconnection channel;

DETAILED DISCLOSURE OF SPECIFIC EMBODIMENTS

The present invention proposes a method for sealing cavities, for example arranged in a matrix, using membranes. The method according to the present invention particularly comprises the transfer of a sealing film, intended to form membranes.

Moreover, in order to ensure a limited and more uniform deformation of the membranes sealing the cavities, the method according to the present invention comprises a step of forming a first contour, which comprises an advantageously continuous first trench surrounding the arrangement of cavities.

Figure 1A:
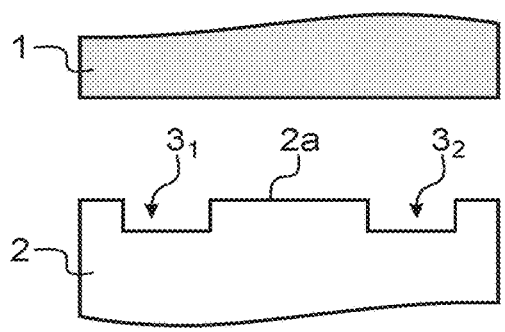
FIGS. 1a, 1b, 1c are illustrations of the different steps of a method for forming membranes known from the prior art.
Figure 1B:
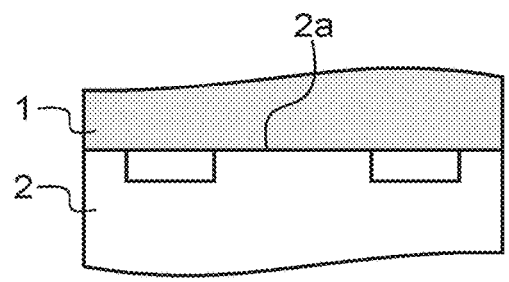
Figure 1C:
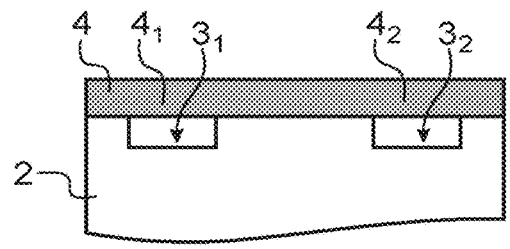
Figure 2A:
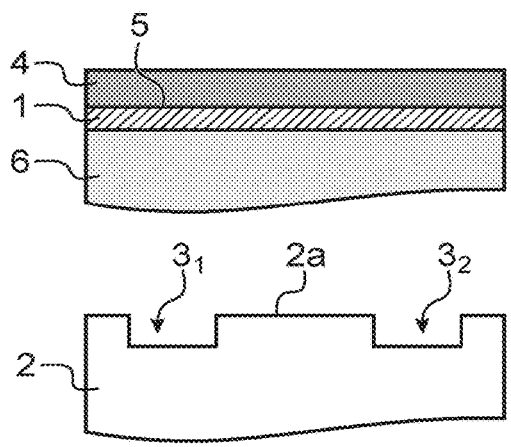
FIGS. 2a, 2b, 2c are illustrations of the different steps of a method for forming membranes known from the prior art.
Figure 2B:
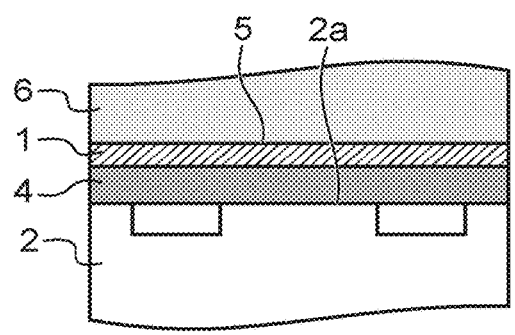
Figure 2C:
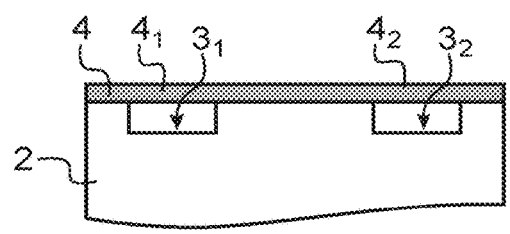
Figure 3A:
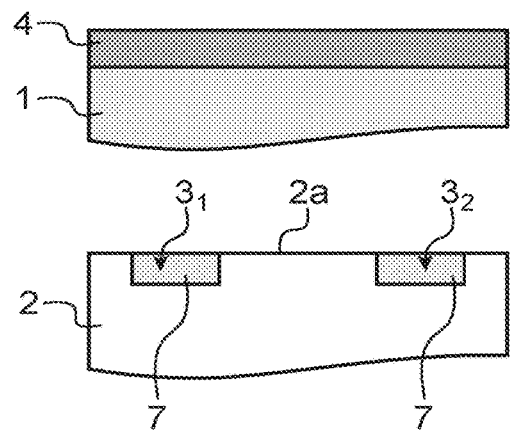
FIGS. 3a, 3b, 3c, 3d, 3e are illustrations of the different steps of a method for forming membranes known from the prior art.
Figure 3B:
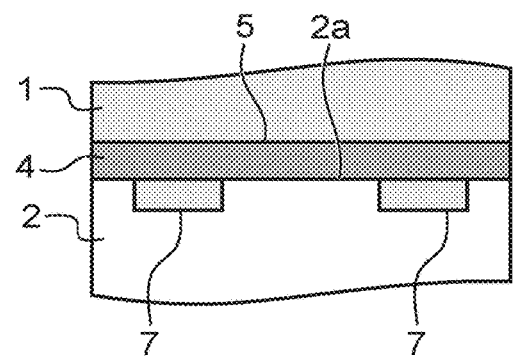
Figure 3C:
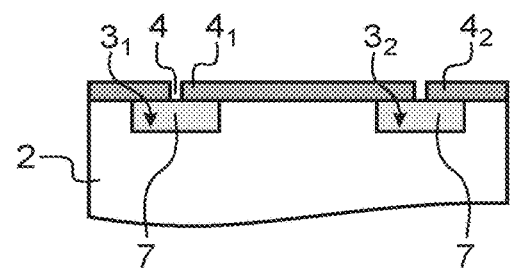
Figure 3D:
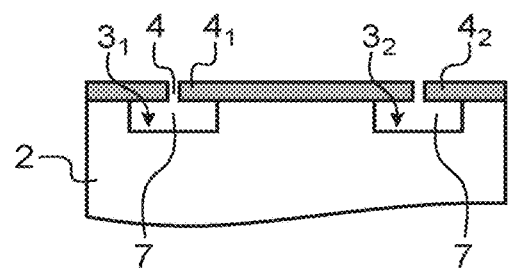
Figure 3E:
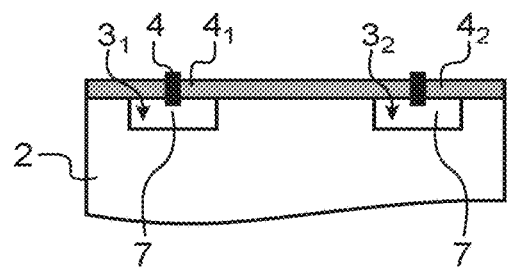
Figure 4A:
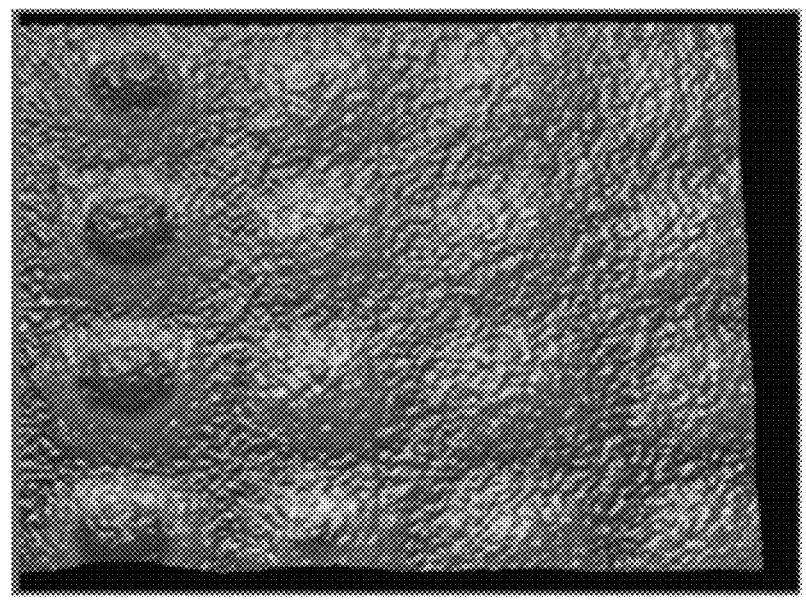
FIG. 4a is an image obtained by optical interferometry of a plurality of membranes in a matrix arrangement (the grayscale being dependent on the height)
Figure 4B:
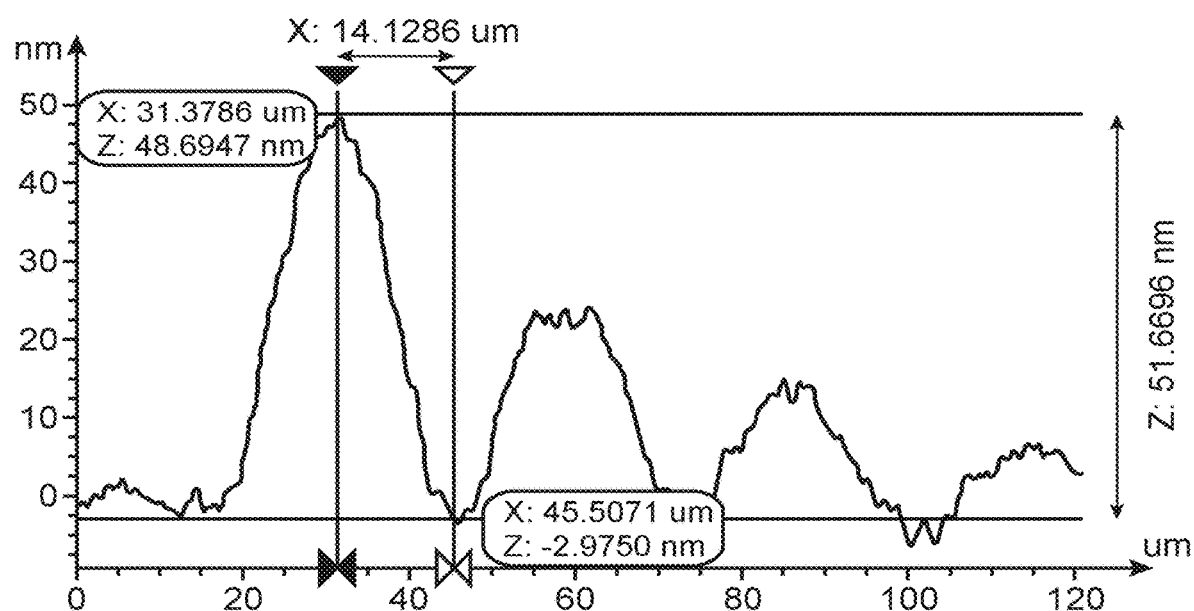
FIG. 4b is a graphic representation of the deformation D (along the vertical axis, in "nm") of membranes according to the position X thereof (increasing from the edge to the centre, horizontal axis, in "µm")
Figure 5:
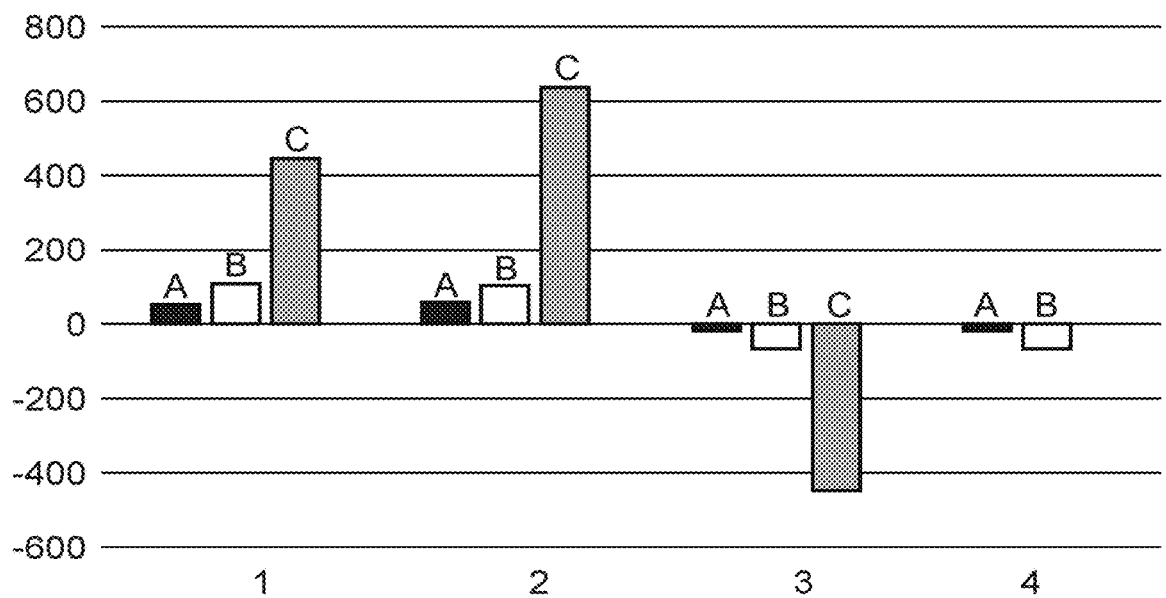
FIG. 5 illustrates, according to the bonding conditions (conditions "1", "2", "3", and "4" along the horizontal axis), the observed amplitude (along the vertical axis, in "nm") of the membrane deformations for sealing film thicknesses of 1.5 µm (A), 0.85 µm (B), and 0.2 µm (C)
Figure 6A:
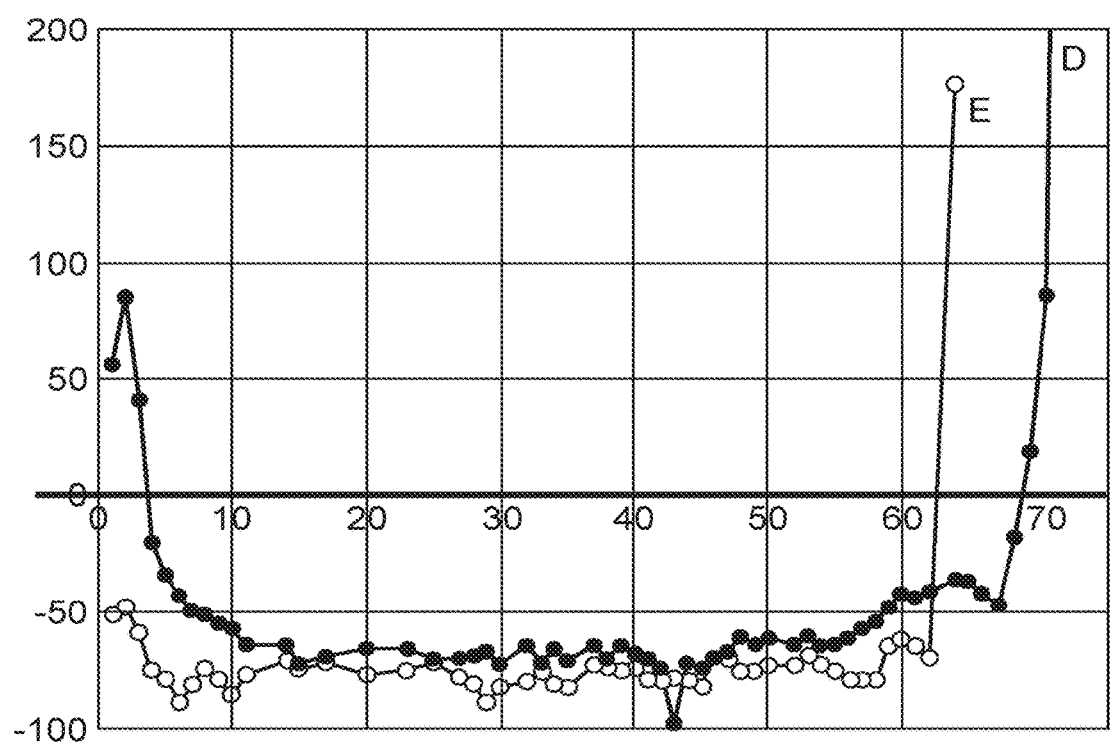
FIG. 6A is a graphic representation of the deformations of the membranes (vertical axis, in "nm") according to the location of the membrane on the matrix (horizontal axis), the curve D and the curve E are associated, respectively, with a matrix in the vicinity of the edge of the receiving substrate and with a matrix in the vicinity of the centre of the receiving substrate.
Figure 6B:
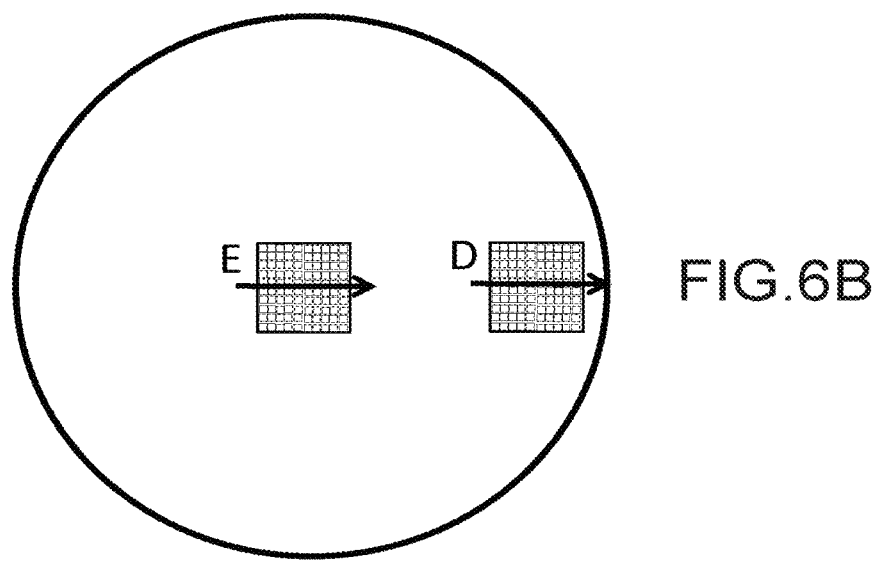
FIG. 6B is a schematic representation of a substrate which comprises a first arrangement E and a second arrangement D of membranes.
Figure 7A:
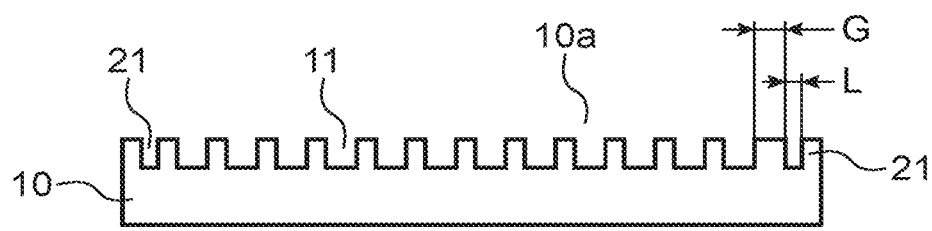
FIGS. 7a, 7b, 7c are illustrations of the different steps of a method according to a first alternative embodiment of a first embodiment of the invention.
Figure 7B:
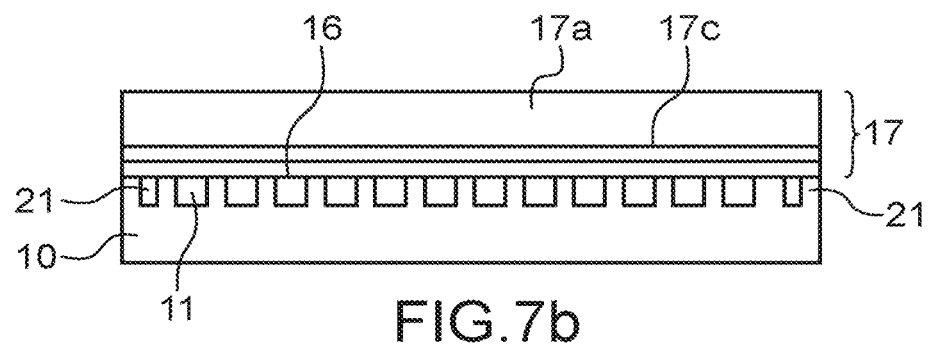
Figure 7C:
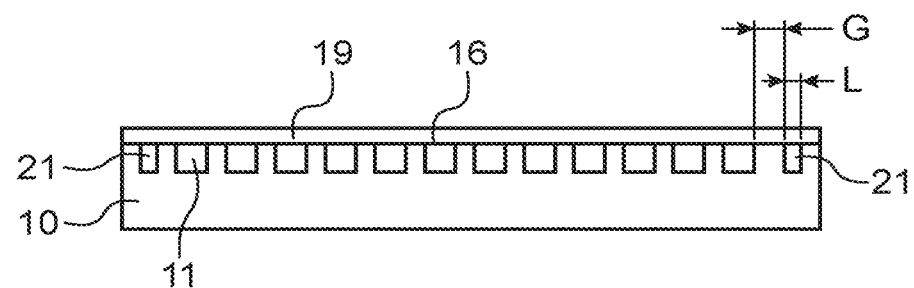

FIGS. 7a-7c á 8a-8c illustrate the different steps of the method for sealing cavities according to a first embodiment of the present invention.

The method particularly comprises a step a) of forming a plurality of cavities 11 opening at a front face 10a of a support substrate 10 (FIG. 7a).

The remainder of the disclosure also relates to the use of a sealing film intended to be transferred using one of the faces thereof, referred to as sealing face, on the front face 10a. According to another aspect of this first embodiment, it may be considered to form the plurality of cavities 11 on the sealing film, and particularly cavities opening at the sealing face. A person skilled in the art, merely by reading the following description, will be capable of implementing this other aspect.

The cavities 11 can, for example, be arranged in a matrix (FIG. 9a).

"Matrix arrangement" denotes a regular arrangement along two different directions, for example orthogonal, of identical cavities 11. The matrix arrangement can particularly comprise n rows and m columns of the cavities 11.

A matrix arrangement according to the present invention is thus not limited to a periodic arrangement along two orthogonal directions of rows and columns. The matrix arrangement can comprise other matrix shapes, such as for example a hexagonal arrangement, or a circular symmetrical arrangement organised in concentric circles.

The cavities 11 have a depth p, a characteristic dimension a, and are spaced apart by a spacing b. For example, once an arrangement according to a rectangular matrix is considered, the spacing b is defined along one and the other of the directions defined by the columns and rows of the cavity matrix (FIG. 9b).

The spacing b, according to the present invention, corresponds to a mean spacing of the cavities of a disorganised arrangement for example.

"Characteristic dimension" denotes the greatest dimension of the cavity opening. The opening may be of circular, square, rectangular shape, or more generally with n sides, and for example polygonal, particularly triangular or hexagonal.

The shape of a cavity according to the present invention is defined by the shape of the opening thereof.

For example, the cavities 11 can have a square shape of side a between 0.5 µm and 500 µm, and a depth p between 10 nm and 10 µm.

The spacing b is advantageously between 1 µm and 500 µm.

The matrix arrangement can comprise several hundred, or several thousand, cavities.

It is understood that an arrangement is delimited by a contour defined by the peripheral cavities of said arrangement (FIG. 9a).

The support substrate can comprise a semiconductor material, advantageously the semiconductor material comprises at least elements chosen from: silicon, germanium, silicon and germanium alloy, indium phosphide, a III-V semiconductor arsenide, a III-V semiconductor phosphide, or a III-V semiconductor nitride, silicon carbide.

The support substrate can comprise a metallic material, advantageously the metallic material comprises at least elements chosen from: aluminium, copper, titanium, tungsten, tungsten silicide, gold.

The support substrate can comprise an insulating material, advantageously the insulating material comprises at least elements chosen from: silicon dioxide, silicon nitride.

The sealing film can comprise a piezoelectric material, advantageously the piezoelectric material comprises at least elements chosen from: lithium tantalate, lithium niobate, aluminium nitride, zinc oxide, zinc and lead tantalate.

Step a) can particularly comprise a masking step for delimiting the contour of the cavities 11, and an etching step.

The masking step can involve the formation of a hard mask, and particularly a silicon dioxide mask.

The etching step can comprise dry etching (for example etching involving a plasma) or wet etching.

The method also comprises a step a1) of forming a first contour.

"First contour" denotes a path, advantageously a closed path, formed by one or more structures recessed in relation to the face of the support whereon it/they is/are formed. The first contour particularly has a width L defined by the structure(s).

The width L of the contour throughout the description corresponds to a mean length. More specifically, the lateral walls of the trench forming the contour can have varying spacing. For example, one and/or the other of these walls can outline a saw-toothed profile, or have irregularities causing width variations.

"Recessed" denotes that the structure(s) has/have a first depth p1.

The first contour can comprise one or more advantageously continuous first trenches.

Figure 21A:
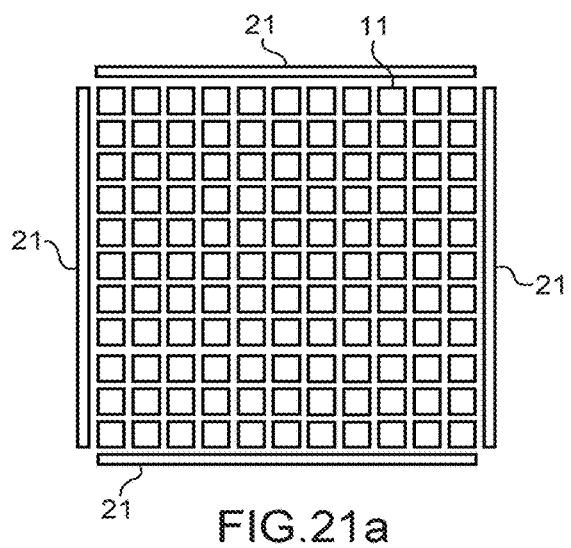
FIG. 21a is a schematic representation of an arrangement of cavities surrounded by a first discontinuous trench, and in particular provided with four cross-sections each disposed in the vicinity of one side of the arrangement of cavities.
Figure 21B:
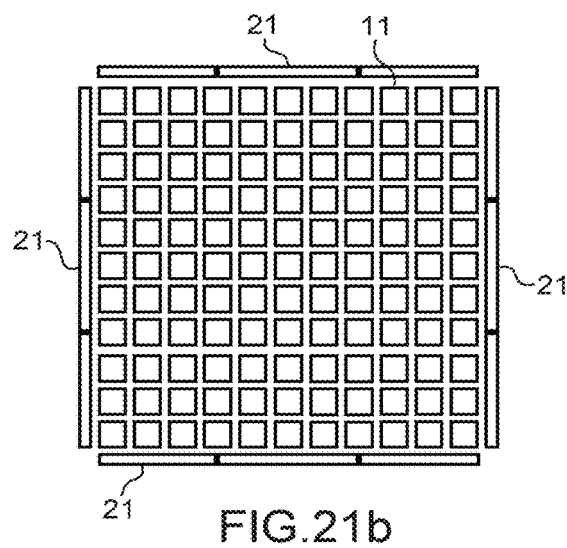
FIG. 21b is a schematic representation of an arrangement of cavities surrounded by a first discontinuous trench, and in particular provided with four discontinuous cross-sections each disposed in the vicinity of one side of the arrangement of cavities.

FIGS. 21a and 21b represent a first contour formed by a first discontinuous trench, and which can particularly comprise four sections, each in the vicinity of one side of the arrangement of cavities.

The remainder of the disclosure of this first embodiment will be confined to a first contour formed by a first continuous trench.

According to this first embodiment, the first trench 21 is formed on the support substrate 10, and opens at the front face 10a.

In particular, the first trench surrounds the arrangement of cavities.

The first trench 21 has a width L, and is at an essentially constant distance G from the arrangement of cavities 11.

In other words, the first trench has the same shape as the contour of said arrangement.

The distance G, throughout the description, represents a mean distance. More specifically, distance variations between the first contour and the arrangement of cavities can be observed.

The first trench 21 has a first depth p1 advantageously equal to the depth p.

Advantageously, step a1) and step a) are performed simultaneously.

According to a preferred embodiment of the present invention, the distance G is between one-fifth of b (b/5) and five b (5×b), advantageously between one-half of b (0.5×b) and two b (2×b), more advantageously between 0.9×b and 1.1×b.

The method according to the present invention also comprises a step b) of forming membranes 19 sealing each of the cavities 11.

Step b) of forming membranes 19 particularly comprises transferring the sealing film 16 on the front face 10a of the support substrate 10, and the first trench 21 (FIGS. 7b, 7c, 8a, 8b et 8c).

More specifically, the transfer comprises assembling the sealing face 16a of the sealing film 16 with the front face 10a.

In other words, the sealing film 16 hermetically seals the first trench 21 and the cavities 11.

The membranes 19 are thus suspended above the cavities 11.

The sealing film 16 can comprise a semiconductor material, advantageously the semiconductor material comprises at least elements chosen from: silicon, germanium, silicon and germanium alloy, indium phosphide, a III-V semiconductor arsenide, a III-V semiconductor phosphide, or a III-V semiconductor nitride, silicon carbide.

The sealing film 16 can comprise a metallic material, advantageously the metallic material comprises at least elements chosen from: aluminium, copper, titanium, tungsten, tungsten silicide, gold.

The sealing film 16 can comprise an insulating material, advantageously the insulating material comprises at least elements chosen from: silicon dioxide, silicon nitride.

The sealing film 16 comprises a piezoelectric material, advantageously the piezoelectric material comprises at least elements chosen from: lithium tantalate, lithium niobate, aluminium nitride, zinc oxide, zinc and lead tantalate.

The sealing film 16 can also comprise a stack of layers, and particularly a stack of LTO and Si.

Figure 8A:
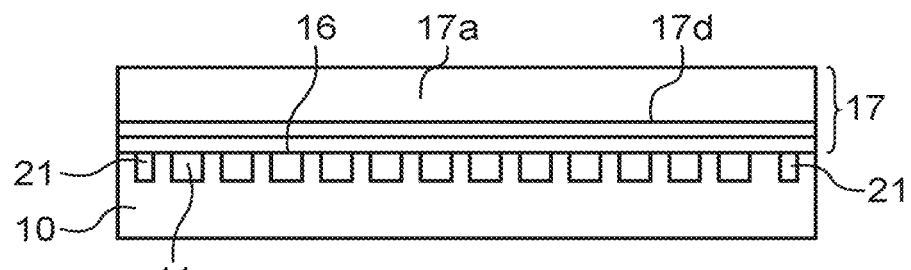
FIGS. 8a, 8b, 8c are illustrations of the different steps of a method according to a second alternative embodiment of a second embodiment of the invention.

The transfer of the sealing film can particularly involve a step b1) of bonding a substrate, referred to as donor substrate 17, on the front face 10a, and a step b2) of removing a first part, referred to as handle substrate 17a, of the donor substrate 17 so as to only retain a second part of said substrate forming the sealing film 16 (FIGS. 7b and 8a).

It is understood that bonding step b1) can comprise molecular (or direct) bonding or thermocompression bonding or eutectic bonding.

Bonding step b1) can also be performed in a vacuum or in a controlled atmosphere particularly to apply a predetermined gas and pressure in the cavities 11 sealed using the sealing film 16.

More generally, any bonding method known to a person skilled in the art can be used within the scope of the present invention.

According to a first alternative embodiment of this first embodiment, step b2) can comprise a thinning step (FIGS. 7a to 7c).

The thinning step can particularly comprise wet etching, dry etching, or mechanical abrasion (grinding).

For example, a handle substrate 17a comprising silicon can be etched using a wet process with a KOH or TMAH solution.

Particularly advantageously and within the scope of this first embodiment, the donor substrate 17 comprises an intermediate layer 17c inserted between the handle substrate 17a and the sealing film 16.

The intermediate layer 17c particularly has a selectivity facing the etching in relation to the sealing film 16. It is thus possible to consider a sealing film 16 thickness less than 20 μm, or 10 μm, for example equal to 5 μm.

The donor substrate 17, according to this alternative, can particularly be a silicon-on-insulator (SOI) substrate, the insulating layer being the intermediate layer. In one embodiment, the silicon layer of the SOI substrate is strongly doped. The barrier layer can be etched using abrasion or using a selective chemical etching step.

Figure 8B:
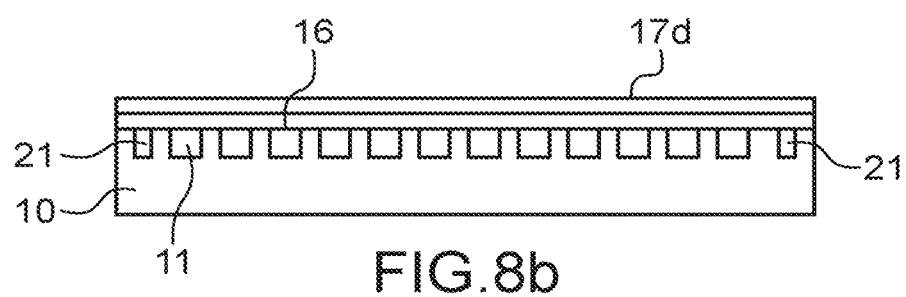
Figure 8C:
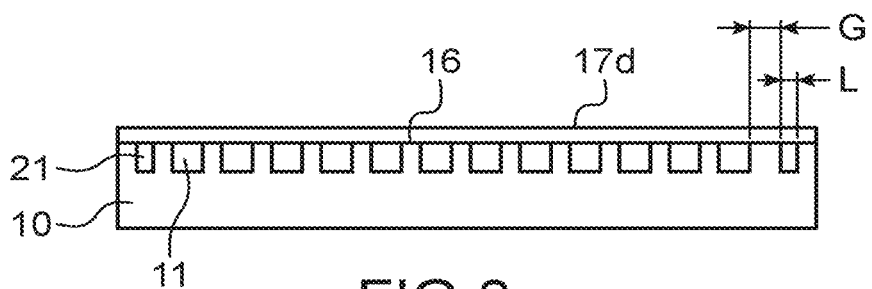

According to a second alternative embodiment of the first embodiment, step b1) can be preceded by a step of forming an embrittlement zone 17d delimiting the sealing film in the donor substrate. The embrittlement zone is particularly a zone at which a fracture of the donor substrate 17 is liable to occur, during the execution of step b2), under the effect of a heat treatment and/or a mechanical action (FIGS. 8a to 8c).

The embrittlement zone 17d can be an amorphised zone or an implanted zone, particularly a zone implanted with hydrogen atoms.

Regardless of the alternative embodiment considered, step a1) can also comprise the formation of at least a second contour 31. The second contour can particularly comprise, like the first contour 21, an advantageously continuous second trench.

The second trench 31 forms a contour, for example closed, around the first trench 21 advantageously at all points at an essentially constant distance from the first trench 21 (FIGS. 10a and 10b).

The depth of the at least a second trench 31, referred to as second depth p2, can be equal to the depth p.

The first trench 21 and the at least a second trench 31 can be linked by one or more interconnection channels 40. In particular, one or more interconnection channels can link two adjacent corners, respectively, of the first trench and the second trench (FIG. 10b).

Particularly advantageously, the sealing film transferred during step b) also seals the at least a second trench.

Considering the first trench 21, and optionally the at least a second trench 31, makes it possible to reduce the non-uniformity in terms of deformation of the membranes liable to be observed between the centre and the edge of the matrix arrangement.

Figure 22:
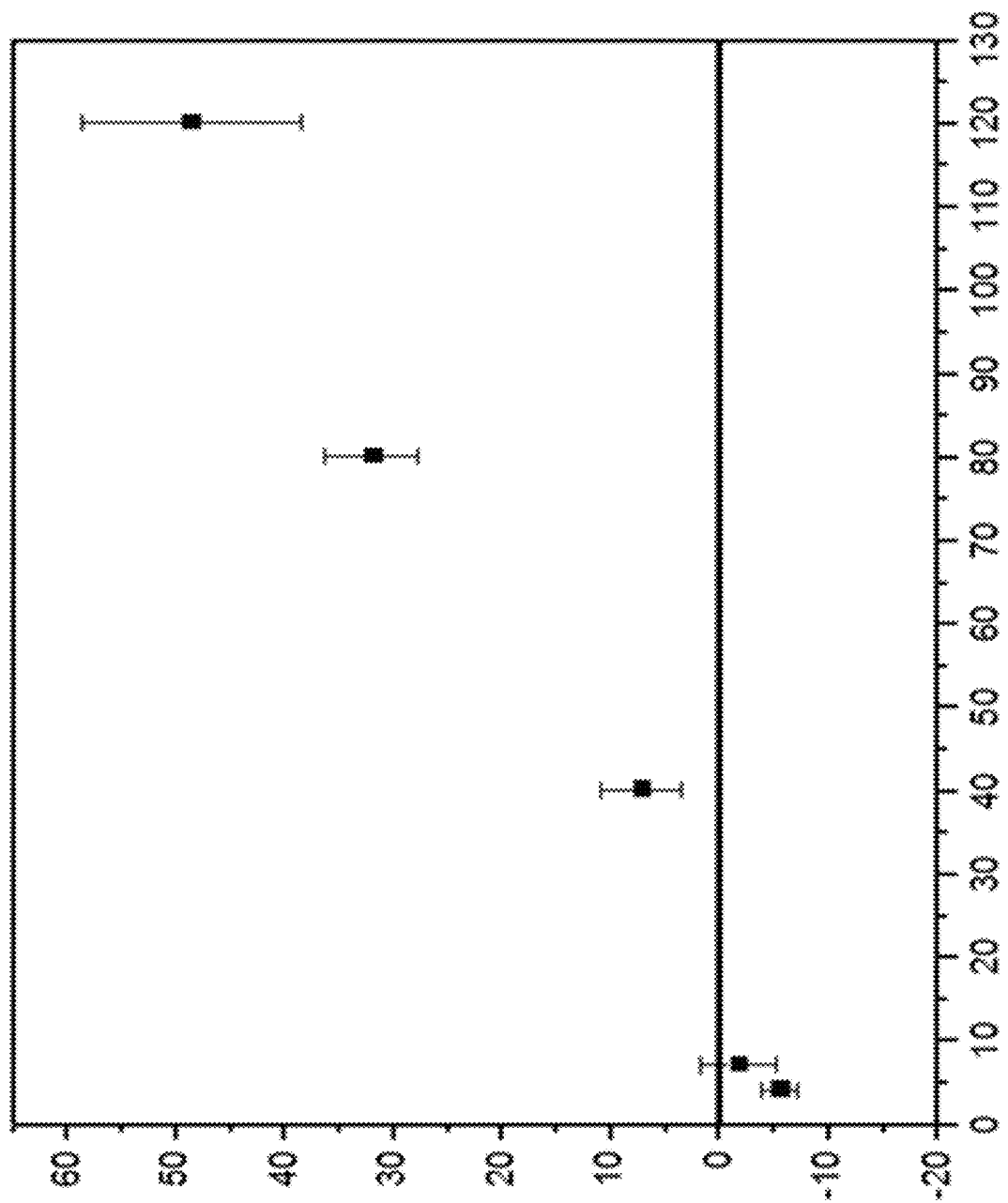
FIG. 22 graphically represents a mean membrane deformation (in "nm" on the vertical axis) according to the spacing b (in "µm", horizontal axis).

In particular, the inventors demonstrated that the distance G has a direct impact on the uniformity of deflection of the membranes circumscribed by the first contour 21. In particular, after sealing the cavities, and more specifically during heat treatments, species are liable to diffuse at the bonding interface. In this regard, the cavities can act as reservoirs. Additionally, the greater the bonded surface area surrounding the cavity, the greater the deformation of the transferred membrane will be. In other words, the distance G can be defined, according to the integration constraints (subsequent contacts, etc.), the distance b separating the cavities of the array and the sought uniformity. Thus, a distance G close to b will make it possible to obtain a better uniformity of deformation of the membranes. On the other hand, considering a distance G greater than b will have little or no beneficial effect. FIG. 22 illustrates this perfectly. The latter graphically represents a mean membrane deformation (in "nm" on the vertical axis) according to the spacing b. It is in this regard worth noting that the deformation increases with the spacing b.

Figure 11A:
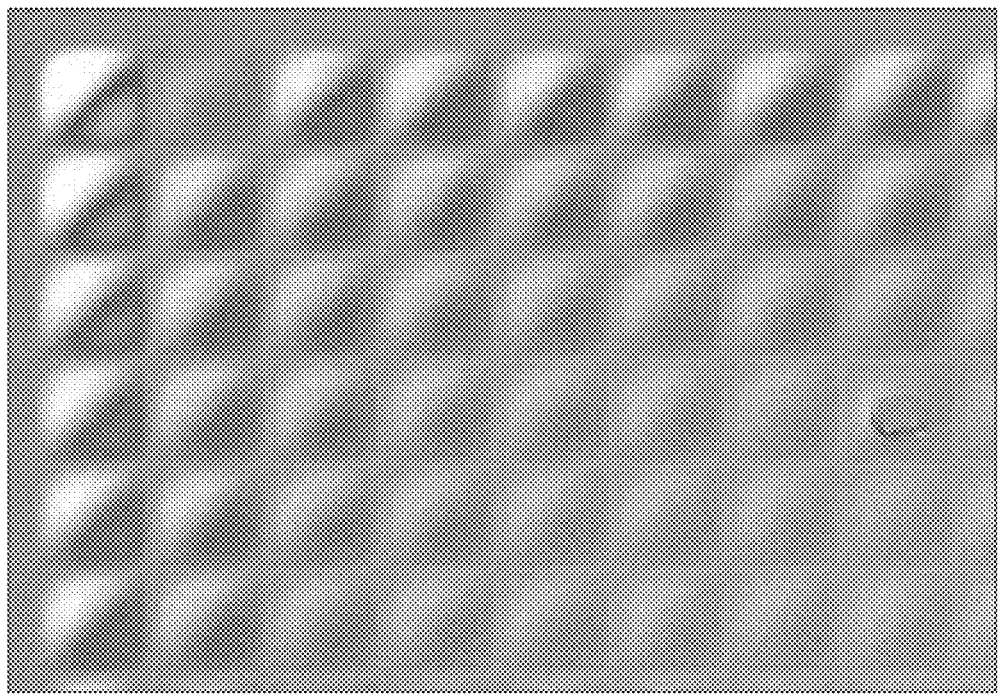
FIGS. 11a, 11b are images obtained using optical microscopy making it possible to observe the effect of the first trench 21 on the deformation of the membranes relative to the deformation observed in the absence of a trench, particularly, FIG. 11a and FIG. 11b each represent an image of the membranes formed, respectively, in the absence of a trench, and in the presence of a trench.
Figure 11B:
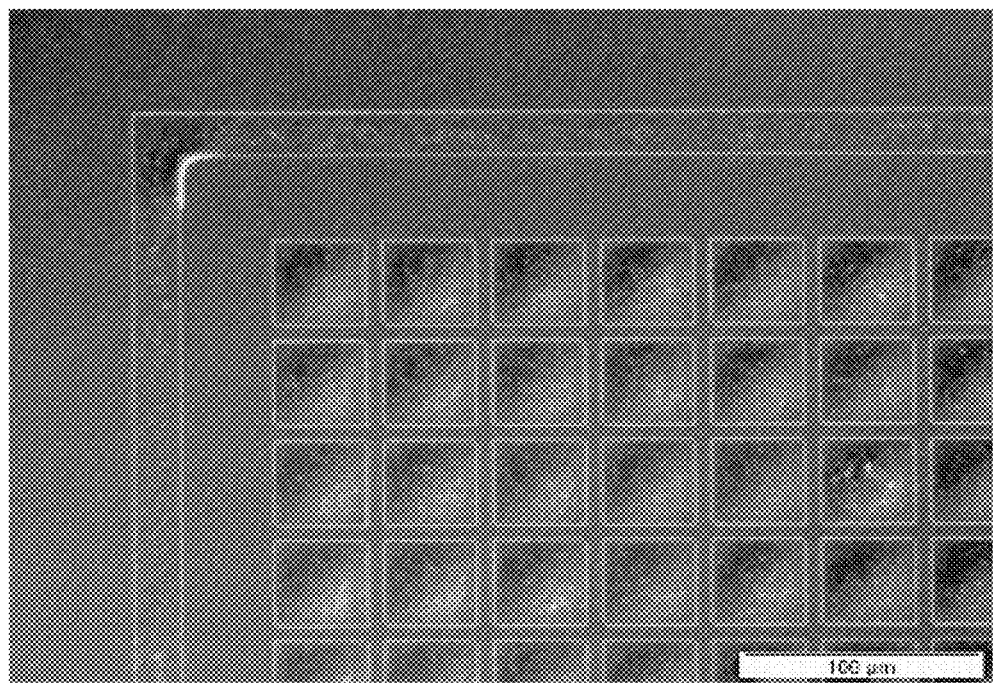

Moreover, FIGS. 11a and 11b are images obtained using optical microscopy making it possible to observe the effect of the first trench 21 on the deformation of the membranes in relation to the deformation observed in the absence thereof.

The comparison of these figures clearly reveals the beneficial effect of the first trench 21 on non-uniformity of the deformation of the membranes. In particular, the first trench makes it possible to reduce non-uniformity of the deformation of the membranes.

Figure 12A:
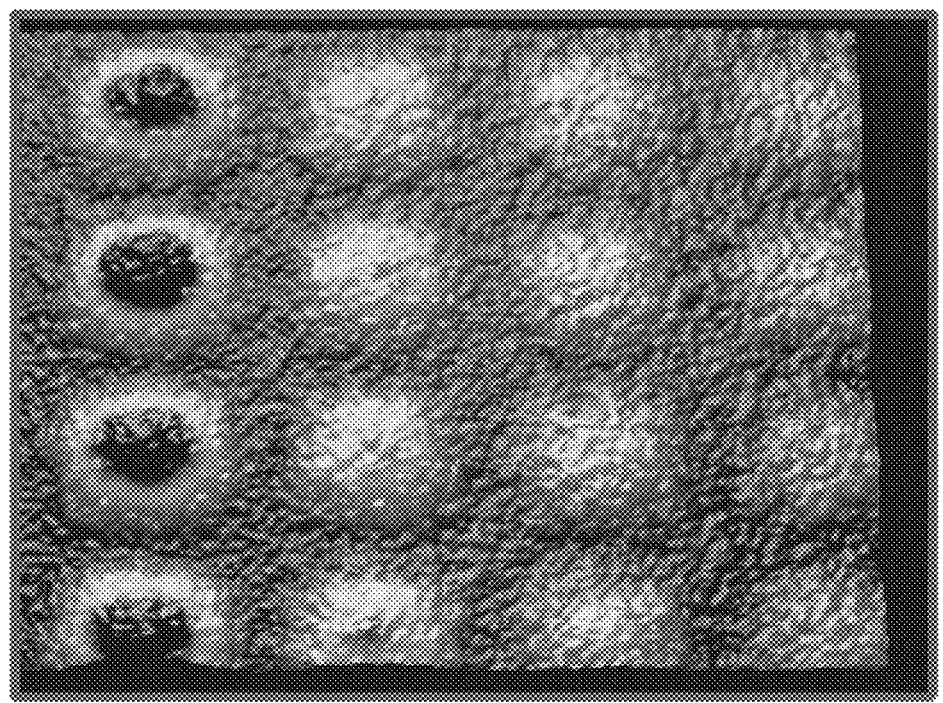
FIGS. 12a, 12b represent measurements using optical interferometry of the zones respectively relative to FIG. 11a and to FIG. 11b.
Figure 12B:
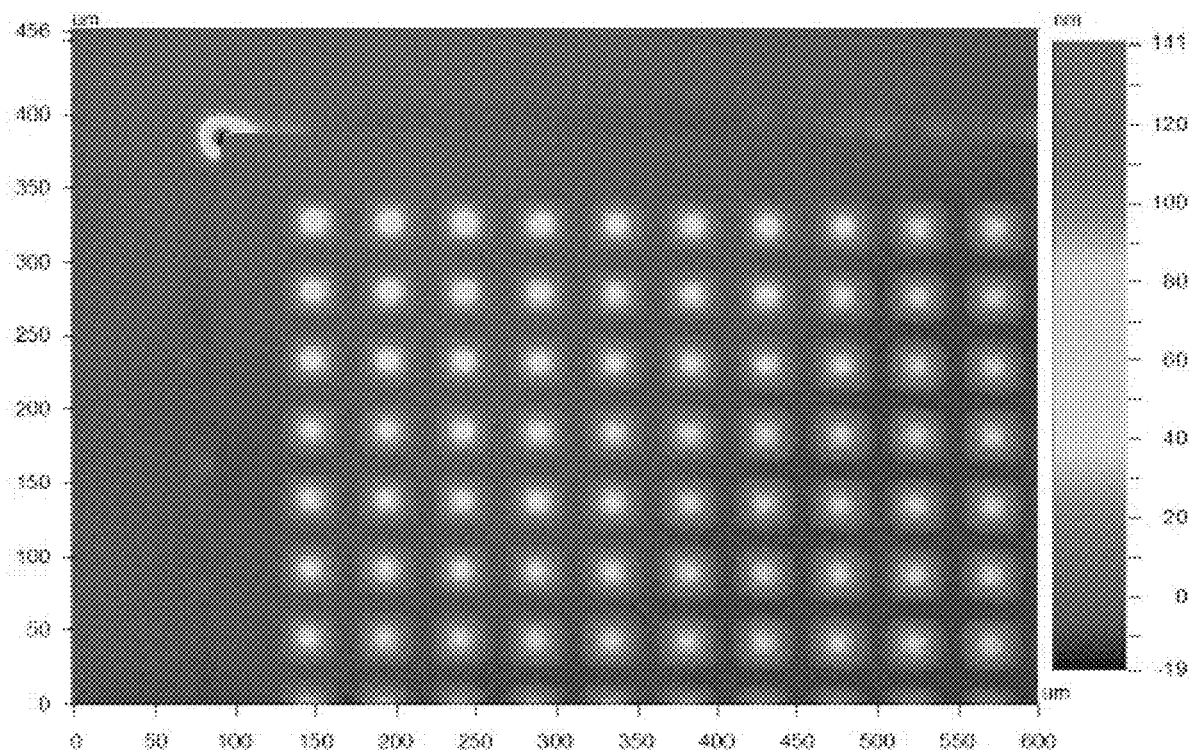

FIGS. 12a and 12b, which lead to the same conclusions, represent measurements using optical interferometry of the zones respectively relative to FIG. 11a and to FIG. 11b. In particular, the amplitude of deformation of the membranes is much more homogeneous from one membrane to another in FIG. 12b.

The method according to the present invention can also comprise a step c), performed after step b), of removing a section of the sealing film overlapping with the first trench and/or the at least a second trench.

In other words, after step c), the sealing film is retained on the cavities, and is removed at the first trench and/or the at least a second trench.

This removal step c) can comprise wet etching or dry etching.

FIGS. 13a, 13b, 14a, 14b and 15 illustrate the different steps of the method for sealing cavities according to a first aspect of a second embodiment of the present invention.

The second production embodiment differs, in this regard, from the first embodiment in that the first contour 21, and the second contour 31 if considered, are formed in the sealing film 16. In particular, the first contour 21 is confined hereinafter in the disclosure to the first trench.

A first aspect of this second embodiment is illustrated in FIGS. 13a, 13b, 14a, 14b and 15.

Figure 13A:
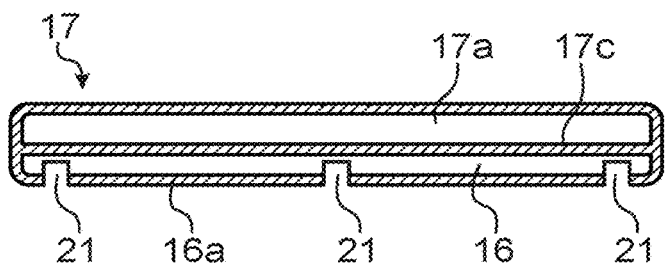
FIGS. 13a, 13b are illustrations of the different steps of a method according to a first aspect (according to a first alternative embodiment) of a second embodiment of the invention.
Figure 13B:
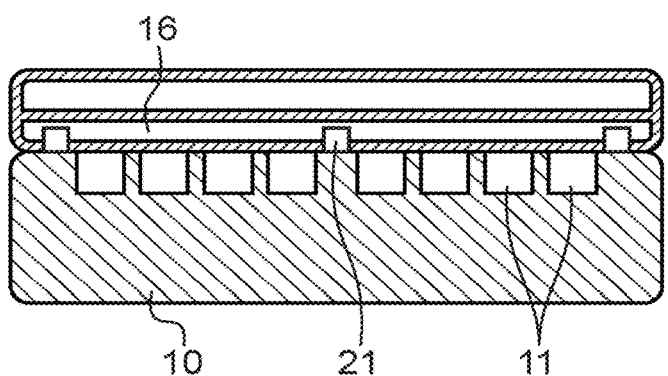
Figure 14A:
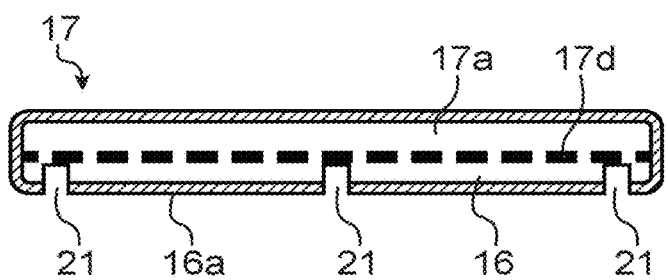
FIGS. 14a, 14b are illustrations of the different steps of a method according to the first aspect (according to a first alternative embodiment) of the second embodiment of the invention.
Figure 14B:
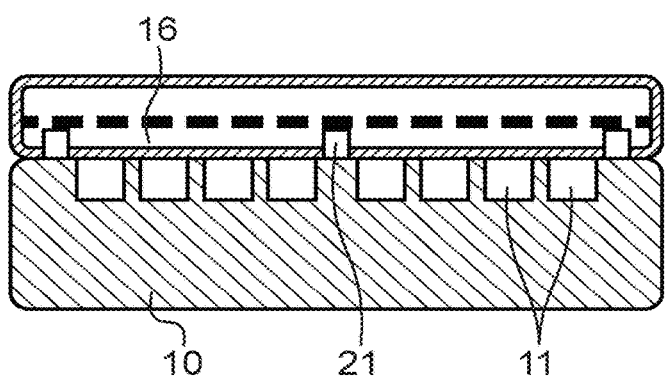

More specifically, the method illustrated in FIGS. 13a and 13b uses the terms of the first alternative embodiment of the first embodiment, whereas the method illustrated in FIGS. 14a and 14b uses the terms of the second alternative embodiment of the first embodiment.

FIGS. 13a and 14a represent a donor substrate 17 on a face whereof (the sealing face 16a) the first contour 21 is formed.

According to this alternative embodiment, the first contour 21 has a first depth less than the thickness of the sealing film.

The support substrate 10, at which the arrangement of cavities 11 is formed is then assembled with the donor substrate 17 (FIGS. 13b and 14b).

Figure 15:
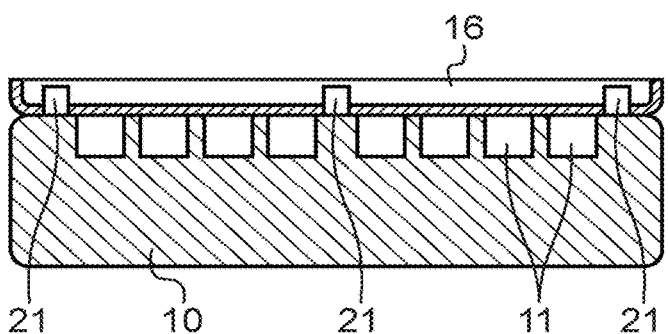
FIG. 15 is an illustration of transfer step b) according to the first aspect (first and second alternative embodiment) of the second embodiment.

After step b), represented in FIG. 15, the arrangement of cavities 11 is circumscribed by the first trench 21.

Regardless of the embodiment or alternative embodiment envisaged, "circumscribed" denotes that the projection of the first trench on the front face surrounds the arrangement of cavities.

It is possible to thin the sealing film 16 so as to uncover the first trench 21.

A second alternative embodiment of this second embodiment is illustrated in FIGS. 16a, 16b, 17a, 17b and 18.

According to this second alternative embodiment, the first trench 21 has a depth greater than the thickness of the sealing film such that after the transfer step, said first trench 21 is exposed to the external environment (FIG. 21).

Figure 16A:
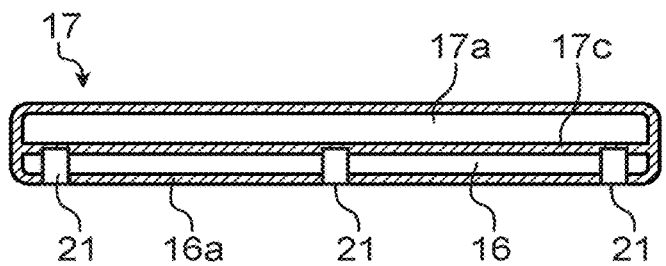
FIGS. 16a, 16b are illustrations of the different steps of a method according to a second aspect (according to a second alternative embodiment) of the second embodiment of the invention.
Figure 16B:
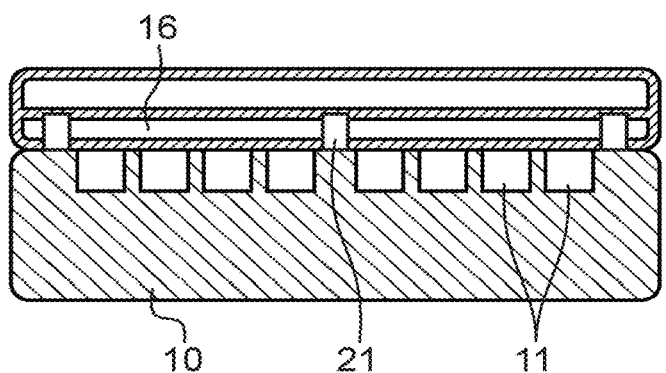
Figure 17A:
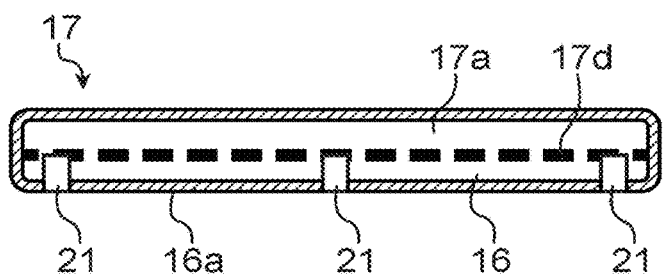
FIGS. 17a, 17b are illustrations of the different steps of a method according to the second aspect (according to a second alternative embodiment) of the second embodiment of the invention.
Figure 17B:
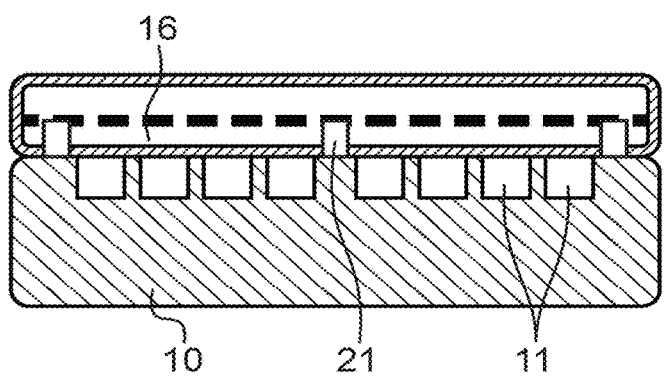
Figure 18:
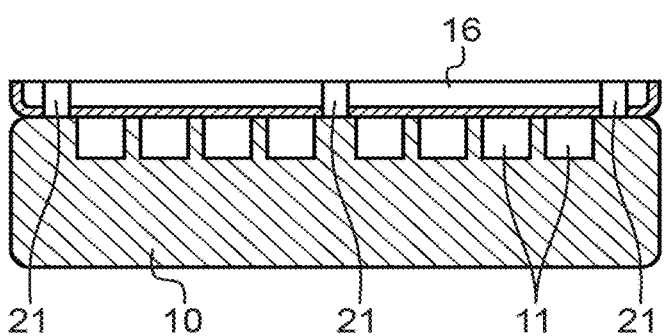
FIG. 18 is an illustration of transfer step b) according to the second aspect (first and second alternative embodiment) of the second embodiment.

The method illustrated in FIGS. 16a and 16b uses the terms of the first alternative embodiment of the first embodiment, whereas the method illustrated in FIGS. 17a and 17b uses the terms of the second alternative embodiment of the first embodiment.

FIGS. 16a and 17a represent a donor substrate 17 on a face whereof (the sealing face 16a) the first contour 21 is formed.

The support substrate 10, at which the arrangement of cavities 11 is formed is then assembled with the donor substrate 17 (FIGS. 16b and 17b).

Figure 19A:
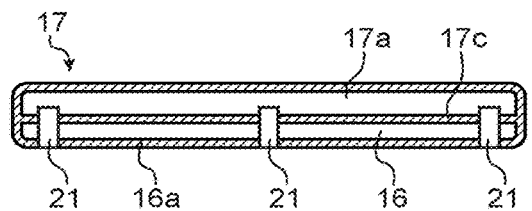
FIGS. 19a, 19b are illustrations of the different steps of a method according to a third aspect (according to a second alternative embodiment) of the second embodiment of the invention.
Figure 19B:
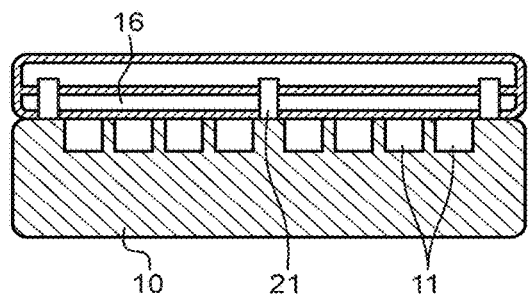
Figure 20:
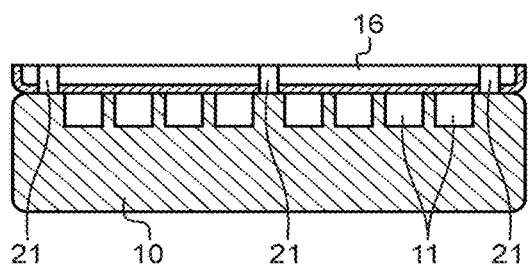
FIG. 20 is an illustration of transfer step b) according to the third aspect (first and second alternative embodiment) of the second embodiment.

FIGS. 19a, 19b, 20 illustrate the different steps of the method for sealing cavities according to a third aspect of the second embodiment of the present invention.

According to this third aspect, the depth of the first trench is greater than the thickness of the sealing film 16.

In particular, the steps of the method illustrated in FIGS. 19a and 19b uses the terms of the method illustrated in FIGS. 16a and 16b. Considering the first trench and/or the at least a second trench makes it possible to damp the deformation of the membranes liable to occur when transferring the sealing film, and hence also reduce the non-uniformity of deformation.

The method according to the present invention is advantageously used for manufacturing MEMS, and particularly MEMS involving resonators each formed by a membrane/cavity pair.

Reducing the deformation sustained by the membranes results in an increase in the combined quality factor of the resonator matrix arrangement, and thus makes it possible to manufacture a much more sensitive matrix arrangement of capacitive ultrasound transducers (cMUT or capacitive micromachined ultrasound transducers) than the arrangements known from the prior art.

The method according to the present invention can also be used for manufacturing removable substrates of which the sealing layer overlapping with the cavities can be detached. The energy involving the detachment between the receiving substrate and the sealing film can be adjusted according to the dimensional characteristics of the matrix arrangement and the cavities.

Regardless of the application envisaged, the method according to the present invention makes it possible to perform subsequent technological steps (such as photolithography, bonding, etching, film deposition steps).

It is finally understood that the first contour and/or the second contour can be formed both on the front face 10a and the sealing face 16a.

The present invention also relates to a device provided with a plurality of cavities 11 sealed using a plurality of membranes 19, the device comprising:
a) a plurality of cavities 11 opening at a front face 10a of a support substrate 10 or at a sealing face of a sealing film, the cavities 11, advantageously arranged in a matrix, have a depth p, a characteristic dimension a, and are spaced apart by a spacing b;
b) a plurality of membranes 19, sealing each of the cavities 11, formed by the sealing film 16 assembled with the front face 10a using the sealing face thereof;
the device further comprises a first contour of a width L on one and/or the other of the front face 10a and the sealing face, the first contour comprising an advantageously continuous first trench 21, and is arranged such that the plurality of cavities 11 is circumscribed by the first contour, said first contour being at an advantageously essentially constant distance G from the plurality of cavities and between one-fifth of b (b/5) and five b (5×b), advantageously between one-half of b (0.5×b) and two b (2×b), more advantageously between 0.9×b and 1.1×b.

The invention claimed is:

1. A method for sealing a plurality of cavities using a plurality of membranes, the method comprising:
(a) forming a plurality of cavities opening at a front face of a support substrate or at a sealing face of a sealing film, wherein the cavities are arranged in a matrix, have a depth p, have a characteristic dimension a, and are spaced apart by a spacing distance b; and
(b) forming a plurality of membranes, sealing each of the cavities, by transferring the sealing film overlapping with the front face, the transferring comprising assembling the sealing face with the front face,
wherein the method further comprises a step (a1), executed before step (b), of forming a first contour on at least one of the front face and the sealing face, the first contour comprising a continuous first trench having a width L and a first depth p1, the formation of the first contour being executed such that, after step (b), the plurality of cavities is circumscribed by the first contour, said first contour being at an essentially constant distance G from the plurality of cavities, with G being between b/5 and 5b.

2. The method according to claim 1, wherein the width L is between a/5 and 5a.

3. The method according to claim 1, wherein the cavities are of square, round, or polygonal shape.

4. The method according to claim 1, wherein the first contour is formed on the front face, and step (b) is followed by a step (c) of partially removing the sealing film so as to uncover the first contour, said partial removing retaining a section of the sealing film circumscribed by the first contour.

5. The method according to claim 1, wherein the first contour is formed on the sealing face, and the first depth p1 is less than a thickness of the sealing film.

6. The method according to claim 1, wherein the first contour is formed on the sealing face, and the first depth p1 is greater than or equal to a thickness of the sealing film such that, after step (b), the first contour is exposed to an external environment.

7. The method according to claim 1, wherein step (a1) further comprises forming a second contour, on at least one of the front face and the sealing face, which comprises a second trench around the first trench, at all points, at an essentially constant distance from the first contour.

8. The method according to claim 7, wherein the first contour and the second contour are linked by at least one interconnection channel, the at least one interconnection channel linking two adjacent corners, respectively, of the first contour and the second contour.

9. The method according to claim 1, wherein the step (b) further comprises a step (b1) of bonding a donor substrate with the support substrate, the donor substrate being provided with the sealing film resting on a handle substrate, followed by a step (b2) of removing the handle substrate.

10. The method according to claim 9, wherein step (b2) further comprises etching by mechanical and/or chemical abrasion.

11. The method according to claim 10, wherein the donor substrate comprises an intermediate layer inserted between the handle substrate and the sealing film, the intermediate layer having an etching selectivity relative to the sealing film and the handle substrate.

12. The method according to claim 9, wherein the donor substrate further comprises an embrittlement zone delimiting the sealing film, and being configured to break by applying mechanical stress and/or a heat treatment.

13. The method according to claim 12, wherein the embrittlement zone is obtained by species implantation.

14. The method according to claim 1, wherein the sealing film comprises a semiconductor material, the semiconductor material comprising elements chosen from: silicon, germanium, silicon and germanium alloy, indium phosphide, a III-V semiconductor arsenide, a III-V semiconductor phosphide, a III-V semiconductor nitride, and silicon carbide.

15. The method according to claim 1, wherein the sealing film comprises a metallic material, the metallic material comprising elements chosen from: aluminium, copper, titanium, tungsten, tungsten silicide, and gold.

16. The method according to claim 1, wherein the sealing film comprises an insulating material, the insulating material comprising elements chosen from: silicon dioxide and silicon nitride.

17. The method according to claim 1, wherein the sealing film comprises a piezoelectric material, the piezoelectric material comprising elements chosen from: lithium tantalate, lithium niobate, aluminium nitride, zinc oxide, zinc, and lead tantalate.

18. A method for manufacturing a micro-electromechanical system, comprising performing the method according to claim 1.

* * * * *